(12) United States Patent
Liao et al.

(10) Patent No.: US 10,050,051 B1
(45) Date of Patent: Aug. 14, 2018

(54) MEMORY DEVICE AND METHOD FOR FABRICATING THE SAME

(71) Applicant: MACRONIX INTERNATIONAL CO., LTD., Hsinchu (TW)

(72) Inventors: Ting-Feng Liao, New Taipei (TW); I-Ting Lin, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/465,770

(22) Filed: Mar. 22, 2017

(51) Int. Cl.
  *H01L 29/49* (2006.01)
  *H01L 27/11568* (2017.01)
(52) U.S. Cl.
  CPC .............. *H01L 27/11568* (2013.01)
(58) Field of Classification Search
  CPC ......... H01L 27/11568; H01L 27/11507; H01L 27/11246
  See application file for complete search history.

(56) References Cited

U.S. PATENT DOCUMENTS

| | | | |
|---|---|---|---|
| 8,934,302 B2 | 1/2015 | Kwak | |
| 9,230,905 B2 | 1/2016 | Takaki et al. | |
| 9,437,609 B2 | 9/2016 | Huo et al. | |
| 9,449,983 B2 | 9/2016 | Yada et al. | |
| 9,543,321 B1* | 1/2017 | Nakajima | H01L 27/11582 |
| 9,799,673 B2* | 10/2017 | Shin | H01L 27/11582 |
| 9,842,907 B2* | 12/2017 | Makala | H01L 29/4975 |
| 2013/0107653 A1 | 5/2013 | Kwak | |

* cited by examiner

*Primary Examiner* — Michael Shingleton
(74) *Attorney, Agent, or Firm* — McClure, Qualey & Rodack, LLP

(57) ABSTRACT

A memory device includes memory includes a multi-layers stack includes a plurality of insulating layers and a plurality conductive layers alternatively stacked on a semiconductor device, a plurality of memory cells formed on the conductive layers, a contact plug passing through the insulating layers and the conductive layers, and a dielectric layer including a plurality of extending parts each of which is inserted between each adjacent two ones of the insulating layers to isolate the conductive layer from the contact plug, wherein any one of the extending parts that has a shorter distance departed from the semiconductor substrate has a size substantially greater than a size of the others that has a longer distance departed from the semiconductor substrate.

15 Claims, 6 Drawing Sheets

MEMORY DEVICE AND METHOD FOR FABRICATING THE SAME

BACKGROUND

Technical Field

The disclosure of the present disclosure generally relates to a memory device and the method for fabricating the same, and more particularly to a non-volatile memory (NVM) device and the method for fabricating the same.

Description of the Related Art

Non-volatile memory (NVM) devices which are able to continually store information even when the supply of electricity is removed from the device containing the NVM cells has been widespread adopted by bulk solid state memory applications in portable audiovisual entertainment devices, cell phones or digital cameras etc. Recently, various 3D memory devices, such as a 3D vertical-channel (VC) flash memory device that has a multi-layer stack structure may possess a higher density memory and excellent electrical characteristics, e.g. reliability in data storage and high operating speed, has been provided in order to accommodate the rising demand for superior memory.

A typical method for fabricating a 3D VC NVM device includes steps as follows: A plural of insulating layers and conductive layers alternatively stacked with each other is firstly formed. A plurality of trenches are then formed in the multi-layers stack to divide the multi-layers stack into a plurality of rigid stacks each of which has a plurality of conductive strips formed by the patterned conductive layers. A memory layer with an ONO composite layer (including a silicon oxide layer, a silicon nitride layer and another silicon oxide layer) and a channel layer are formed in sequence on the bottoms and sidewalls of the trenches, so as to define a plurality memory cells connected in series and disposed at the intersection points of the conductive strips, the memory layer and the channel layer.

However, because of the nature of the etching process, each of the trenches used to define the rigid stacks may have a cross-sectional profile tapered from top to down, and the conductive strips disposed at different levels of the multi-layers stack that are respectively serve as the gates of the memory cells at the same cells string may thus have different lateral size. Such that the gates of the memory cells of the same cells string that are disposed at different levels may have different resistance, by which the operation performance of the memory cells may be deteriorated.

Therefore, there is a need of providing a memory device and the method for fabricating the same to obviate the drawbacks encountered from the prior art.

SUMMARY

In one Embodiment of the present disclosure, a memory device is disclosed, wherein the memory device includes a semiconductor substrate, a multi-layers stack, a plurality of memory cells, a contact plug and a dielectric layer. The multi-layers stack includes a plurality of insulating layers and a plurality conductive layers alternatively stacked on the semiconductor device. The memory cells are formed on the conductive layers. The contact plug passes through the insulating layers and the conductive layers. The dielectric layer includes a plurality of extending parts, and each of which is inserted between each adjacent two ones of the insulating layers to isolate the conductive layer from the contact plug, wherein one of the extending parts that has a shorter distance departed from the semiconductor substrate has a size substantially greater than a size of the others that has a longer distance departed from the semiconductor substrate.

In accordance with another embodiment of the present disclosure, a method for fabricating a memory device is provided, wherein the method includes steps as follows: Firstly, a multi-layers stack having a plurality of insulating layers and a plurality of conductive layers alternatively stacked with each other is formed on a semiconductor substrate, and a plurality of memory cells are formed on the conductive layers simultaneously. Next, a dielectric layer includes a plurality of extending parts is formed in the multi-layers stack, wherein each of the extending parts is inserted between adjacent two ones of the insulating layers to isolate the conductive layers from the contact plug, wherein any one of the extending parts that has a shorter distance departed from the semiconductor substrate has a size substantially greater than a size of the others that has a longer distance departed from the semiconductor substrate. Subsequently, a contact plug is formed passing through the insulating layers and the conductive layers and isolated from the conductive layers by the dielectric layer.

In accordance with the aforementioned embodiments of the present disclosure, a memory device and the method for fabricating the same are provided. A multi-layers stack having a plurality of insulating layers and a plurality of conductive layers alternatively stacked with each other is firstly formed on a semiconductor substrate, and a plurality of memory cells are formed in the multi-layers stack simultaneously. Next a first etching back process is performed to remove portions of the conductive layer through a through-hole passing through the multi-layers stack, so as to define one of a plurality of recesses between each of the conductive layers and adjacent two ones of the insulating layers. A protection layer is then formed in the recesses. A second etching back process is then performed to remove portions of the conductive layers and the protection layer through the through opening. Subsequently, a dielectric layer is formed to fulfill the recess, and the through opening is then fulfilled with a conductive material to form a contact plug electrically isolated from the conductive layers by the dielectric layer.

The remaining size of the conductive layers and the length of the dielectric layer extending into the recesses can be manipulated by both controlling the size of the protection layer formed in the recesses and controlling the operation time of the second etching process. Such that, the remaining conductive layers disposed at different levels of the multi-layers stack to serve as the gates of the memory cells involved in the same cells string with vertical channel can have the same size, and the resistance variation among these gates can fall within the tolerance range. In addition, a proper bridge widow between the contact plug and these gates can be provided by the isolation of the dielectric layer having enough length extending into the recesses, and the current leakage of the memory cells can be avoided. As a result, the operation performance and reliability of the memory device can be significantly increased.

The above objects and advantages of the present disclosure will become more readily apparent to those ordinarily skilled in the art after reviewing the following detailed description and accompanying drawings, in which:

DETAILED DESCRIPTION

Figure 1A:
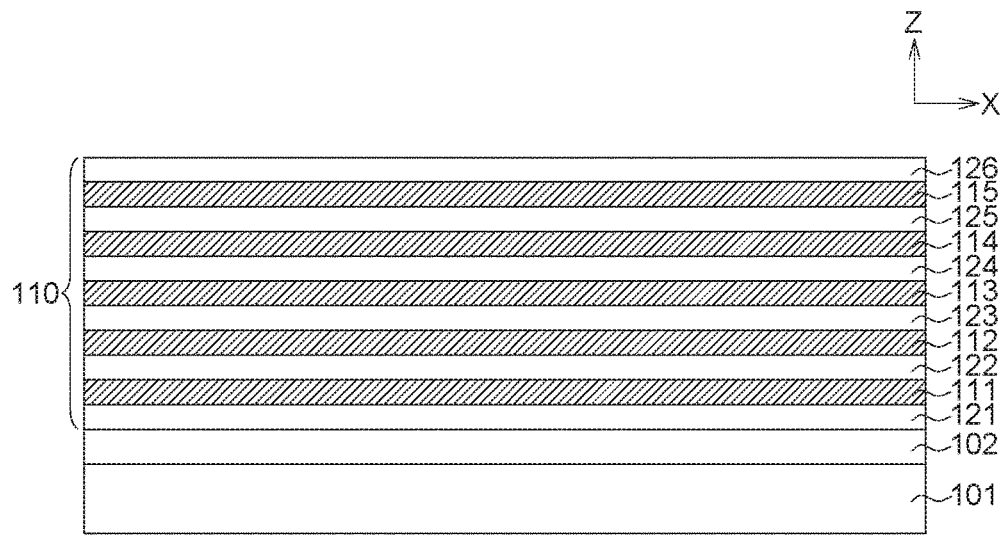
FIGS. 1A to 1K are cross-sectional views illustrating the processing structures for forming a memory device in accordance with one embodiment of the present disclosure.
Figure 1B:
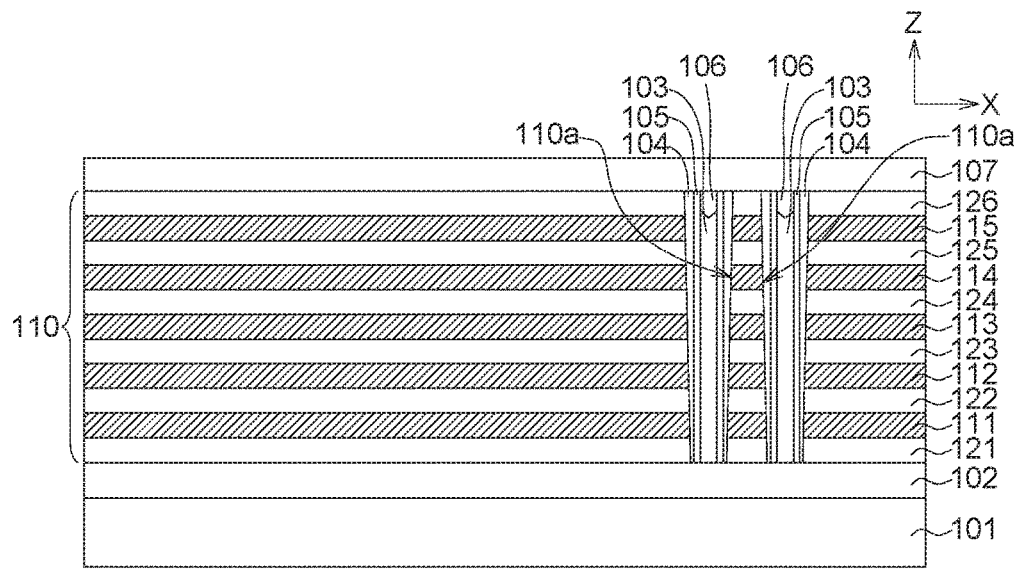

The embodiments as illustrated below provide a memory device and the method for fabricating the same to improve its operation performance and reliability. The present disclosure will now be described more specifically with reference to the following embodiments illustrating the structure and method for fabricating the memory device.

It is to be noted that the following descriptions of the preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1K are cross-sectional views illustrating the processing structures for forming a memory device 100 in accordance with one embodiment of the present disclosure. In the present embodiment, the memory device 100 may be (but not limited) a vertical channel NAND flash memory device. The method for fabricating the memory device 100 includes steps as follows: Firstly, a semiconductor substrate 101 is provided. In some embodiments of the present disclosure, the semiconductor substrate 101 may be made of a p-type doped, n-type doped or undoped semiconductor material, such as poly-silicon, germanium (Ge) or any other suitable semiconductor material.

Next, a conductive layer 102 is formed on the semiconductor substrate 101; and a multi-layers stack 110 is then formed on the conductive layer 102. In some embodiments of the present disclosure, the conductive layer 102 may a poly-silicon layer or a doped semiconductor material layer formed in the semiconductor substrate 101. The multi-layers stack 110 includes a plurality of insulating layers 121-125 and a plurality of sacrificing layers 111-115 formed on the isolation layer 103. The insulating layers 121-126 and the sacrificing layers 111-115 are parallel to each other and alternatively stacked on the conductive layer 102 along the Z-axil. In the present embodiment, the insulating layer 126 serves as the top-most layer of the multi-layers stack 110, and the insulating layer 121 serves as the bottommost layer of the multi-layers stack 110 and directly in contact with the conductive layer 102 (see FIG. 1A).

In some embodiments of the present disclosure, the sacrificing layers 111-115 and the insulating layers 121-126 may be both formed by a low pressure chemical vapor deposition (LPCVD), however, the material for configuring the sacrificing layers 111-115 may be different from that for configuring can made of silicon-nitride compounds, such as SiN, SiON, silicon carbonitride (SiCN), or the arbitrary combinations thereof. The insulating layers 121-126 may be made of dielectric material other than the material made of the sacrificing layers 111-115, such as silicon oxide, silicon carbide (SiC), silicate or the arbitrary combinations thereof. In the present embodiment, the sacrificing layers 111-115 are made of SiN with a thickness about 520 angstroms (Å), and the insulating layers 121-126 are made of silicon dioxide ($SiO_2$) with a thickness about 280 Å.

Next, an etching process is performed to form a plurality of first through openings 110a passing through the multi-layers stack 110, so as to expose a portion of the conductive layer 102. In some embodiments of the present disclosure, the etching process can be an anisotropic etching process, such as a reactive ion etching (RIE) process, performed on the multi-layers stack 110 using a patterned hard mask layer (not shown) as an etching mask. The first through openings 110a may be a plurality of through holes passing through the multi-layers stack 110 and the isolation layer 103 along the Z-axil used to expose a portion of the conductive layer 102 serving as the bottom of the first through openings 110a and to expose portions of the sacrificing layers 111-115, the insulating layers 121-126 and the isolation layer 103 serving as the sidewalls of the first through openings 110a. In the present embodiment, each of the first through openings 110a has a cross-sectional profile tapered from top to down along the Z-axil.

Next, a memory layer 104 and a channel layer 105 are formed in sequence on sidewalls of the first through opening 110a to make the memory layer 104 disposed between the channel layer 105 and the remaining sacrificing layers 111-115. In some embodiments of the present disclosure, the forming of the memory layer 104 includes (but not limited to) an oxide-nitride-oxide (ONO) structure, an oxide-nitride-oxide-nitride-oxide (ONONO) structure or an oxide-nitride-oxide-nitride-oxide-nitride-oxide (ONONONO) structure. The channel layer 105 is made of undoped poly-silicon.

Thereafter, the first through openings 110a are filled by a dielectric material 103, such as silicon dioxide ($SiO_2$). After the dielectric material 103 is etched back, a bond pad 106 may be formed on the dielectric material 103 to form an electrical contact with the channel layer 105, and a clapping layer 107 is then provide to cover the bond pad 106 and the multi-layers stack 110 (see FIG. 1B). In the present embodiment, the clapping layer 107 includes silicon oxide.

Figure 1C:
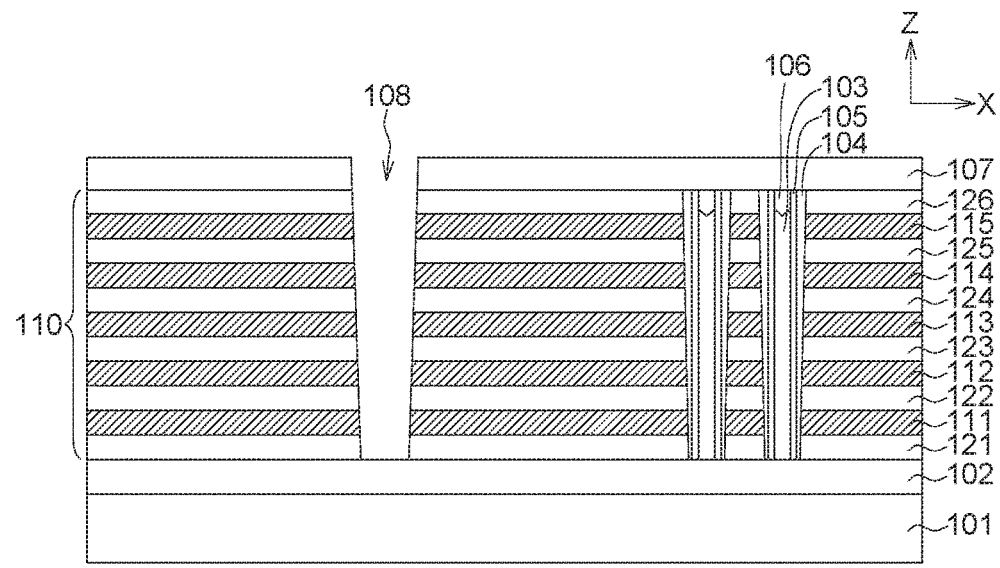
Figure 1D:
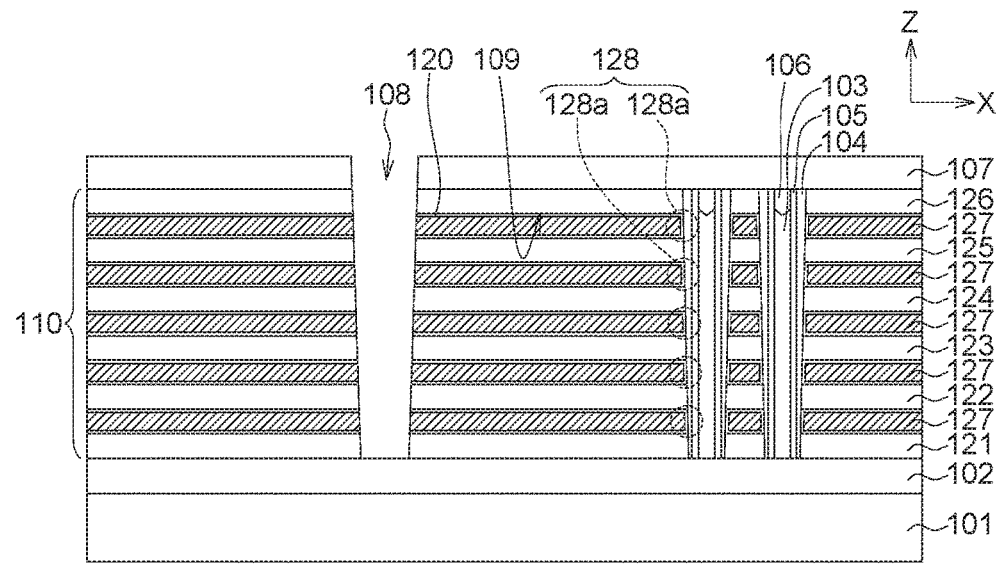
Figure 1E:
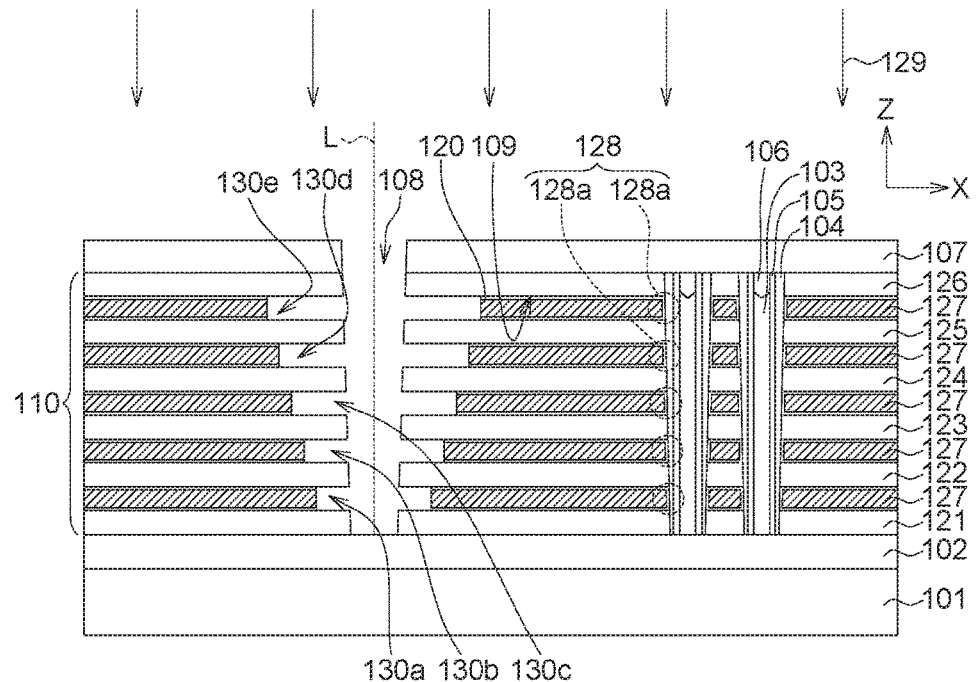
Figure 1F:
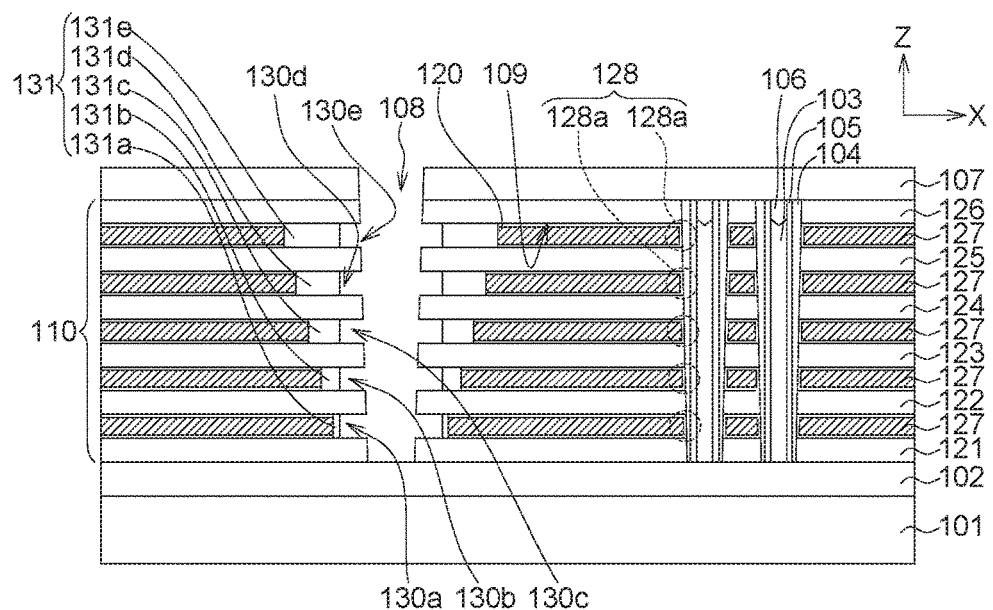
Figure 1G:
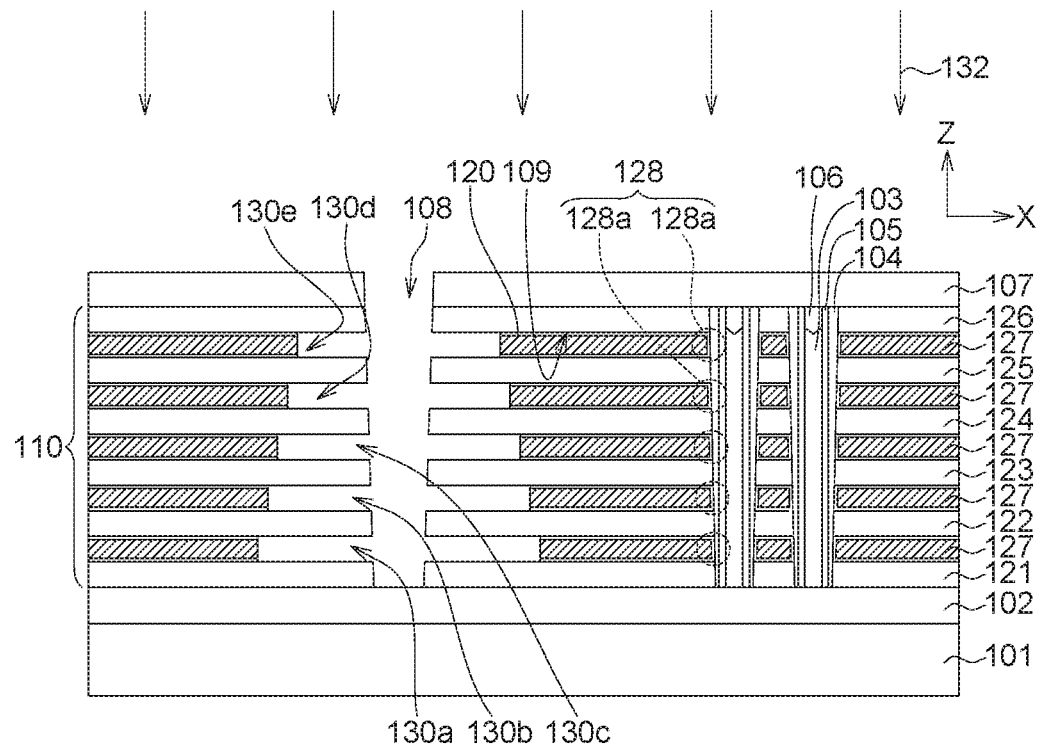
Figure 1H:
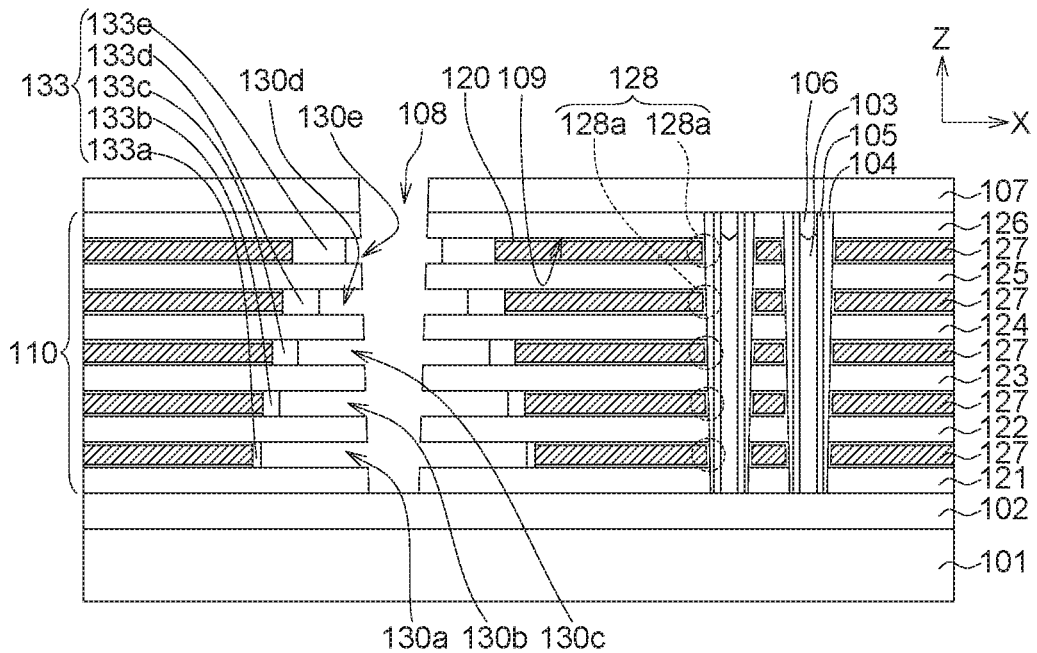
Figure 1I:
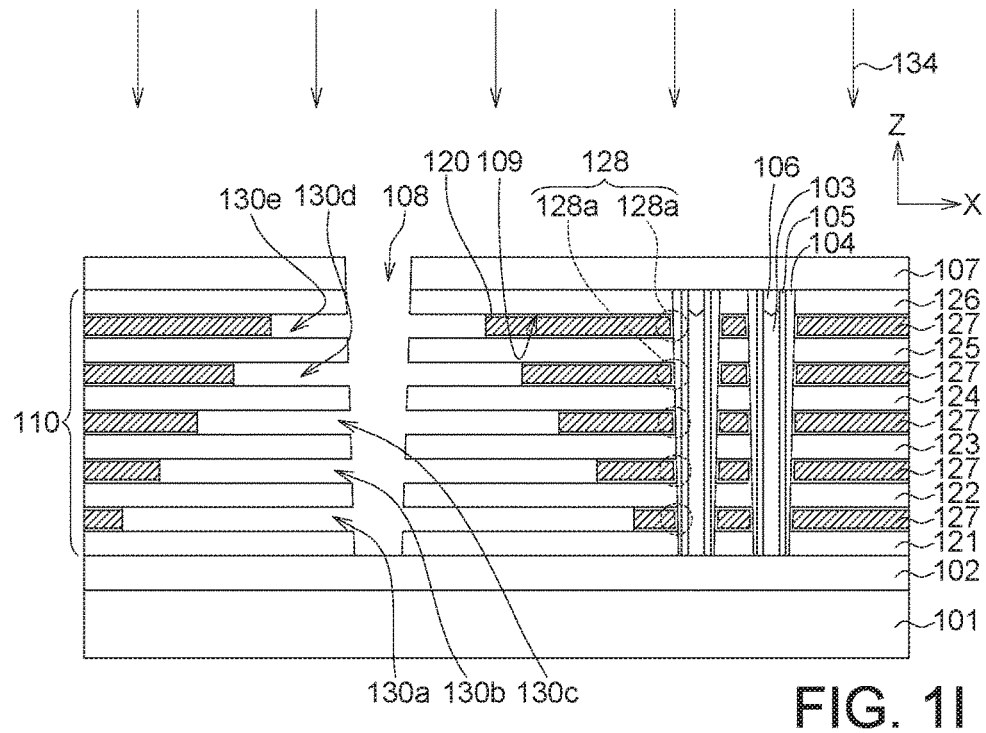
Figure 1J:
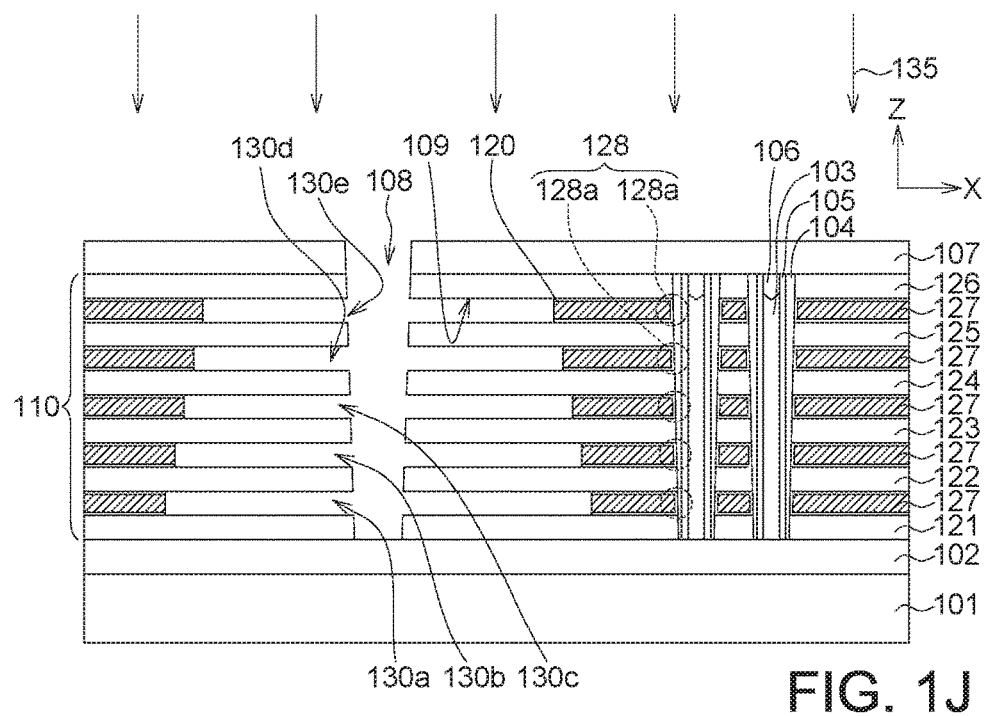

Subsequently, another etching process is performed to form at least one second through opening 108 passing through the multi-layers stack 110 along the Z-axil from the top surface of the multi-layers stack 110, so as to partially expose the sacrificing layers 111-115, the insulating layers 121-126 and the top surface of the conductive layer 102 (see FIG. 1C). In some embodiments of the present disclosure, the at least one second through opening 108 can be a plurality of slits passing through the multi-layers stack 110; and the at least one second through opening 108 also has a cross-sectional profile tapered from top to down along the Z-axil.

The remaining sacrificing layers 111-115 is then removed. In the present embodiment, phosphoric acid ($H_3PO_4$) solution is utilized to remove the remaining sacrificing layers 111-115 through the second through opening 108, so as to form a plurality of spaces 109 between the insulating layers 121-126 and to expose portions of the memory layer 105. Next, a dielectric lining 120 made of aluminum oxide ($Al_2O_3$) may be formed by an LPCVD process on the sidewalls of the recess 109 defined by the insulating layers 121-126 and the memory layer 104. In some embodiments of the present embodiment, the dielectric lining 120 can be a high-dielectric-constant (high-K) layer.

After, the dielectric lining 120 is formed, a plurality of conductive layers 127 are formed on the positions (the recess 109) where the remaining sacrificing layers 111-115 initially occupied. As a result, a plurality of memory cells 128a can be defined at the intersection points of the conductive layers 127, the dielectric lining 120, the memory layer 104 and the channel layer 105, so as to form at least one memory cells string 128 with a vertical channel which can be assembled to form a memory array (not shown) in the multi-layers stack 110 (see FIG. 1D). In some embodiments of the present disclosure, the conductive layers 127 may be made by poly-silicon, metal or other suitable conductive material. In the present embodiment, the conductive layers 127 are a plurality metal layers made of tungsten (W).

After the forming of the conductive layers 127, a first etching back process 129 is performed to remove portions of the conductive layers 127 through the second through opening 108, so as form a recess between each of the conductive layers 127 and two adjacent ones of the insulating layers 121-126. For example, in the present embodiment, a recess 130a is formed between the bottommost one of the conductive layers 127 and the two adjacent insulating layers 121 and 122; a recess 130b is formed between the second level one of the conductive layers 127 and the two adjacent insulating layers 122 and 123; a recess 130c is formed between the third level one of the conductive layers 127 and the two adjacent insulating layers 123 and 124; a recess 130d is formed between the fourth level one of the conductive layers 127 and the two adjacent insulating layers 124 and 125; and a recess 130e is formed between the top-most one of the conductive layers 127 and the two adjacent insulating layers 125 and 126. Due to the nature of the etching back process 129, any one of the recesses that is disposed at a higher level of the multi-layers stack 110 (e.g. the top-most recess 130e) has a lateral size measured from an central axle L of the second through opening 108 substantially greater than a lateral size of the others that are disposed at lower levels (e.g. the recesses 130a-130d). In other words, the recesses 130a-130e respectively extend outwards from sidewalls of the second through opening 108 and have an assembled structure with a cross-sectional profile tapered from top to down along the Z-axil (see FIG. 1E).

Next, a protection layer 131 is formed at least partially filled in the recesses 130a-130e. In some embodiments of the present disclosure, the protection layer 131 can be a polymer layer formed by an LPCVD process using fluromethane ($CH_3F$) as the reaction gas, wherein the protection layer 131 has a plurality of filling parts 131a-131e respectively extending into the corresponding recesses 130a-130e. It should be appreciated that the material for forming the protection layer 131 is not limited as these regards, any material having a etch selecting rate other than that of the conductive layers 127 may be used to form the protection layer 131.

In some embodiments of the present disclosure, the filling parts 131a-131e of the protection layer 131 may not fulfill the recesses 130a-130e. Because the LPCVD process for forming the protection layer 131 is performed in the second through opening having a cross-sectional profile tapered from top to down along the Z-axil, due to the nature of the deposition process, any one of the filling parts 131a-131e that is disposed at a higher level of the multi-layers stack 110 (e.g. the top-most filling part 131e) has a lateral size substantially greater than a lateral size of the others that are disposed at lower levels of the multi-layers stack 110 (e.g. the filling part 131a-131d) (see FIG. 1F).

A second etching back process 132 is then performed to remove portions of the conductive layers 127 and the protection layer 131. Because any one of the filling parts 131a-131e that is disposed at a higher level of the multi-layers stack 110 (e.g. the top-most filling part 131e) has a lateral size substantially greater than a lateral size of the others that are disposed at lower levels of the multi-layers stack 110 (e.g. the filling part 131a-131d), when any one of the filling parts 131a-131e that is disposed at a higher level (e.g. the top-most filling part 131e) is thoroughly removed by the second etching back process 132, the other filling parts (e.g. the filling part 131a-131d) can be also thoroughly removed by the second etching back process 132, in addition portions of the conductive layers 127 that are disposed at the lower levels of the multi-layers stack 110 can be also removed by the second etching back process 132 (see FIG. 1G). In other words, the portions of the filling part that is disposed at a higher level (e.g. the top-most filling part 131e) removed by the second etching back process 132 may be less than the removed portions of the other filling parts that are disposed at lower levels of the multi-layers stack 110 (e.g. the filling part 131a-131d). In some embodiments of the present disclosure, the second etching back process 132 may thoroughly remove the filling part 131e and partially remove the conductive layer 127 disposed in the top-most recess 130e. However, in some other embodiments, the second etching back process 132 may not thoroughly remove the filling part 131e and the conductive layer 127 disposed in the top-most recess 130e may be remained intact.

In some embodiments of the present disclosure, the process of forming another protection layer and preforming a following etching back can be repeated several times. For example, a protection layer 133 having a plurality of filling parts 133a-133e are formed in the recesses 130a-130e (see FIG. 1H), and then a third etching back process 134 similar to the second etching back process 132 is then performed to remove portions of the conductive layers 127 and the filling parts 133a-133e (see FIG. 1I). In addition, yet another etching back process, such as etching back process 135, not following a protection layer forming process may be performed, after the first etching back process 129 (see FIG. 1J).

Subsequently, a dielectric layer 136 is formed in the second through opening 108. In some embodiments of the present disclosure, the forming of the dielectric layer 136 may include steps as follows: Epitaxial silicon is firstly grown in the second through opening 108 and the recesses 130a-130e by a deposition process; and a low temperature oxidation (LTO) process is then performed under an operation temperature ranging from 300° C. to 450° C. with reaction gases to form a silicon oxide layer on the sidewalls and the bottom of the second through opening 108, meanwhile the recesses 130a-130e are fulfilled by the silicon oxide layer. In the present embodiment, the dielectric layer 136 includes at least one vertical sidewall 136a blanket over the sidewalls of the second through opening 108 and a plurality of extending parts 136b-136f respectively extending into the corresponding recesses 130a-130e, wherein any one of the that has a longer distance departed from the semiconductor substrate 101 (e.g. the top-most extending part 136f) has a lateral size substantially less than a lateral size of the other extending parts that has a shorter distance departed from the semiconductor substrate 101 (e.g. the extending parts 136b-136e). In other words, the dielectric layer 136 have a cross-sectional profile tapered from down to top along the Z-axil (see FIG. 1K).

Figure 1K:
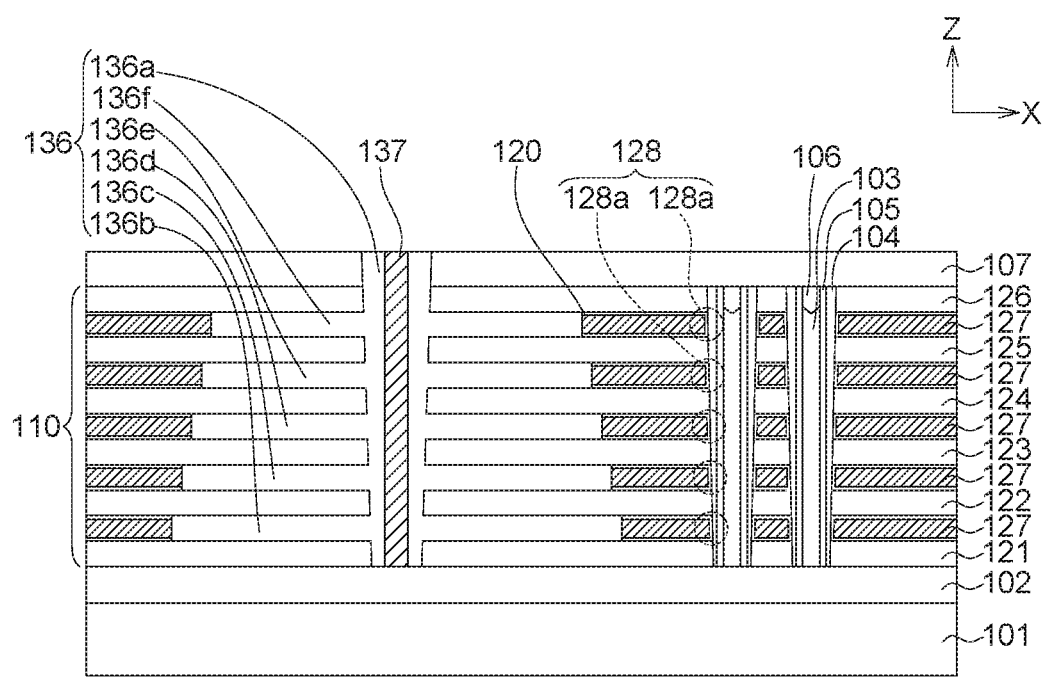

After the portion of the dielectric layer 136 disposed on the bottom of the second through opening 108 is removed, the second through opening 108 is then fulfilled by a conductive material, such as metal (e.g. titanium (Ti), W, Aluminum (Al), copper (Cu), gold (Au), silver (Ag) or the alloys of these metals), metal oxide (e.g. titanium nitride (TiN)) or other suitable material, so as to form a contact plug 137 electrically isolated from the conductive layers 127 by the dielectric layer 136, and electrically contacting to the conductive layer 102 in the second through opening 108. And after series back end of line (BEOL) processes (not shown) are carried out, the memory device 100 as shown in FIG. 1K can be accomplished.

By both controlling the size of the filling parts 131a-131e and 133a-133e formed in the recesses 130a-130e and controlling the etching time of the first etching back process 129, the second etching process 132, the third etching back process 134 and the fourth etching back process 135, the size of the remaining conductive layers 127 and the length of the dielectric layer 136 extending into the recesses 130a-130e can be manipulated. Such that, the remaining conductive layers 127 disposed at different levels of the multi-layers stack 110 to serve as the gates of the memory cells 128a involved in the same cells string 128 with vertical channel can have a substantially the same size, and the resistance variation among these gates can fall within the tolerance range. In addition, a proper bridge widow between the contact plug 137 and the gates can be provided by the isolation of the dielectric layer 136 having enough length extending into the recesses 130a-130e, and the current leakage of the memory cells 128a can be avoided. As a result, the operation performance and reliability of the memory device 100 can be significantly increased.

In accordance with the aforementioned embodiments of the present disclosure, a memory device and the method for fabricating the same are provided. A multi-layers stack having a plurality of insulating layers and a plurality of conductive layers alternatively stacked with each other is firstly formed on a semiconductor substrate, and a plurality of memory cells are formed in the multi-layers stack simultaneously. Next a first etching back process is performed to remove portions of the conductive layer through a through-hole passing through the multi-layers stack, so as to define one of a plurality of recesses between each of the conductive layers and adjacent two ones of the insulating layers. A protection layer is then formed in the recesses. A second etching back process is then performed to remove portions of the conductive layers and the protection layer through the through opening. Subsequently, a dielectric layer is formed to fulfill the recess, and the through opening is then fulfilled with a conductive material to form a contact plug electrically isolated from the conductive layers by the dielectric layer.

The remaining size of the conductive layers and the length of the dielectric layer extending into the recesses can be manipulated by both controlling the size of the protection layer formed in the recesses and controlling the operation time of the second etching process. Such that, the remaining conductive layers disposed at different levels of the multi-layers stack to serve as the gates of the memory cells involved in the same cells string with vertical channel can have a substantially the same size, and the resistance variation among these gates can fall within the tolerance range. In addition, a proper bridge widow between the contact plug and these gates can be provided by the isolation of the dielectric layer having enough length extending into the recesses, and the current leakage of the memory cells can be avoided. As a result, the operation performance and reliability of the memory device can be significantly increased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a semiconductor device;
   a multi-layers stack, comprising a plurality of insulating layers and a plurality first conductive layers alternatively stacked on the semiconductor device;
   a plurality of memory cells formed on the conductive layers;
   a contact plug passing through the insulating layers and the conductive layers; and
   a dielectric layer comprising a plurality of extending parts each of which is inserted between each adjacent two ones of the insulating layers to isolate the conductive layer from the contact plug;
   wherein any one of the extending parts that has a shorter distance departed from the semiconductor substrate has a size substantially greater than a size of the others that has a longer distance departed from the semiconductor substrate.

2. The memory device according to claim 1, further comprising:
   a channel layer, disposed on at least one sidewall of at least one first through opening passing through the insulating layers and the first conductive layers; and
   a memory layer, disposed between the channel layer and the first conductive layers to define a plurality of memory cells at intersection points of the first conductive layers, the channel layer and the memory layer.

3. The memory device according to claim 2, wherein the contact plug is disposed in a second through opening passing through the insulating layers and the first conductive layers; each of the first conductive layers and adjacent tow ones of the insulating layers define a recess communicating with the second through opening; and each of the extending parts extends into the corresponding recess.

4. The memory device according to claim 3, wherein the first through opening and the second through opening has a cross-sectional profile tapered along a direction departing from the semiconductor substrate; and the extending parts have a substantially the same size.

5. The memory device according to claim 1, further comprising a dielectric lining disposed between each of the first conductive layers and adjacent tow ones of the insulating layers.

6. The memory device according to claim 1, further comprising a second conductive layer disposed between the semiconductor substrate and the multi-layers stack, electrically contacting to the contact plug and electrically isolated from the first conductive layers.

7. The memory device according to claim 1, wherein the dielectric layer have a cross-sectional profile tapered along a direction departing from the semiconductor substrate.

8. A method for fabricating a memory device, comprising:
   providing a semiconductor device;
   providing a multi-layers stack having a plurality of insulating layers and a plurality of first conductive layers alternatively stacked with each other on a semiconductor substrate;
   forming a plurality of memory cells on the first conductive layers;
   forming a contact plug passing through the insulating layers and the first conductive layers;

forming a dielectric layer comprising a plurality of extending parts in the multi-layers stack, wherein each of the extending parts is inserted between adjacent two ones of the insulating layers to isolate the first conductive layers from the contact plug, wherein any one of the extending parts that has a shorter distance departed from the semiconductor substrate has a size substantially greater than a size of the others that has a longer distance departed from the semiconductor substrate; and wherein the contact plug is isolated from the first conductive layers by the dielectric layer.

9. The method according to claim 8, wherein the process for forming the memory cells comprises:
  forming a plurality of sacrificing layers on the semiconductor substrate and alternatively stacked with the insulating layers;
  forming a first through opening passing through the insulating layers and the first conductive layers;
  forming a channel layer on at least one sidewall of the first through opening;
  forming a memory layer, disposed between the channel layer and the sacrificing layers;
  forming a second through opening passing through the insulating layers and the first conductive layers;
  removing the sacrificing layers through the second through opening;
  forming a plurality of first conductive layers on the positions where the sacrificing layers initially occupied to define the memory cells at intersection points of the first conductive layers, the channel layer and the memory layer.

10. The method according to claim 8, wherein the process for forming the dielectric layer comprises:
  forming a second through opening passing through the insulating layers and the first conductive layers;
  defining one of a plurality recesses between each of the first conductive layers and adjacent two ones of the insulating layers, wherein any one of the recesses that has a longer distance departed from the semiconductor substrate has a size substantially greater than a size of the others that has a shorter distance departed from the semiconductor substrate; and
  depositing a dielectric material to fill the recesses.

11. The method according to claim 10, prior to depositing a dielectric material, further comprising:
  performing a first etching back process to remove portions of the first conductive layers through the second through opening, so as to form the recesses;
  forming a protection layer in the recess; and
  performing a second etching back process to remove portions of the first conductive layers and the protection layer through the second through opening and the recesses.

12. The method according to claim 11, after the first etching back process, further comprising steps of performing a third etching back process to remove portions of the first conductive layers through the second through opening and the recesses not following a protection layer forming process.

13. The method according to claim 10, prior to forming the first conductive layers, further comprising steps of forming a dielectric lining on each adjacent two ones of the insulating layers.

14. The method according to claim 10, prior to forming the multi-layers stack, further comprising steps of forming a second conductive layer on the semiconductor substrate.

15. The method according to claim 14, wherein the process for forming the contact plug comprises:
  removing a portion of the dielectric layer disposed on a bottom of the second through opening; and
  fulfilling the second through opening with a conductive material.

* * * * *